US012765368B2

(12) United States Patent
Franchi et al.

(10) Patent No.: US 12,765,368 B2
(45) Date of Patent: Oct. 13, 2026

(54) TRANSISTORS WITH SELECTIVELY LANDED GATE ARRAY

(71) Applicant: SEMICONDUCTOR COMPONENTS INDUSTRIES, LLC, Phoenix, AZ (US)

(72) Inventors: Jimmy Robert Hannes Franchi, Enköping (SE); Krister Gumaelius, Vaxholm (SE); Jaein An, Bucheon (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 940 days.

(21) Appl. No.: 18/053,177

(22) Filed: Nov. 7, 2022

(65) Prior Publication Data

US 2024/0153850 A1 May 9, 2024

(51) Int. Cl.

*H01L 23/532* (2006.01)
*H10D 62/832* (2025.01)
*H10D 84/03* (2025.01)
*H10D 84/60* (2025.01)
*H10D 84/83* (2025.01)
(Continued)

(52) U.S. Cl.

CPC ...... *H10W 20/484* (2026.01); *H10D 62/8325* (2025.01); *H10D 84/035* (2025.01); *H10D 84/641* (2025.01); *H10D 84/83* (2025.01); *H10W 20/4441* (2026.01)

(58) Field of Classification Search

CPC ........... H01L 23/4824; H01L 23/53257; H01L 23/585; H01L 23/5226; H01L 23/5283; H10D 62/8325; H10D 84/035; H10D 84/641; H10D 84/83; H10D 62/127; H10D 64/519; H10D 64/517

See application file for complete search history.

(56) References Cited

U.S. PATENT DOCUMENTS

| | | | |
|---|---|---|---|
| 8,530,304 | B2 | 9/2013 | Coppens et al. |
| 8,648,410 | B2 | 2/2014 | Coppens et al. |
| 8,872,276 | B2 | 10/2014 | Loechelt et al. |

(Continued)

OTHER PUBLICATIONS

International Search Report and Written Opinion for counterpart International Application No. PCT/US2023/077770, mailed Jun. 13, 2024, 23 pages.

(Continued)

*Primary Examiner* — Cuong B Nguyen
(74) *Attorney, Agent, or Firm* — Brake Hughes Bellermann LLP

(57) ABSTRACT

A semiconductor device may include a plurality of transistors, with a first array of low-resistance material formed in a first dielectric layer, with a gate subset of the first array formed on a plurality of gate electrodes of the transistors, and a source subset of the first array formed on a plurality of source regions of the transistors. A second array of low-resistance material may be formed in a second dielectric layer, with a gate subset of the second array formed on the gate subset of the first array and thereby electrically connected to the plurality of gate electrodes, and a source subset of the second array formed on the source subset of the first array and thereby electrically connected to the plurality of source regions.

20 Claims, 14 Drawing Sheets

(51) Int. Cl.

| | |
|---|---|
| ***H10W 20/40*** | (2026.01) |
| ***H10W 20/44*** | (2026.01) |

(56) References Cited

U.S. PATENT DOCUMENTS

| | | | |
|---|---|---|---|
| 10,483,383 B2 | 11/2019 | Weyers et al. | |
| 2004/0058480 A1 | 3/2004 | Nesbit et al. | |
| 2015/0340344 A1 | 11/2015 | Lin et al. | |
| 2017/0271451 A1* | 9/2017 | Matsushita .......... | H10D 64/252 |
| 2018/0026130 A1 | 1/2018 | Siemieniec et al. | |

OTHER PUBLICATIONS

PCT/ISA/206 for counterpart International Application No. PCT/US2023/077770, mailed Feb. 22, 2024, 11 pages.

* cited by examiner

TRANSISTORS WITH SELECTIVELY LANDED GATE ARRAY

TECHNICAL FIELD

This description relates to semiconductor devices.

BACKGROUND

Semiconductor devices are typically formed on portions of a wafer, such as a Silicon (Si) wafer, a Silicon Carbide (SiC) wafer, or a Gallium Nitride (GaN) wafer. Areas of a wafer in which devices are formed may be referred to as active areas.

Semiconductor devices are typically provided with electrical connections, so that, for example, the semiconductor devices may be controlled or operated by external devices. For example, a gate of a transistor may be required to be electrically connected to a power source, so that the transistor may be turned on or off. In many cases, multiple devices (e.g., transistors) may be formed on a wafer and controlled by a common electrical connection, such as when a gate pad is connected to an external power source and a gate runner connects the gate pad to a plurality of gates/transistors.

It may be desirable to make such electrical connections relatively large where feasible, in order to ensure reliable and consistent connectivity of the various devices. However, the electrical connections may consume valuable surface area of the wafer that could otherwise be used to increase device density. Consequently, wafer surface areas used by electrical connections may be referred to as dead areas. Therefore, a conflict exists between establishing reliable electrical connections of semiconductor devices and avoiding dead areas on wafers.

Attempts to resolve this conflict may add further complications to the design and implementation of semiconductor devices. For example, routing of metal tracks for gate connections may require interrupting metal routing for other transistor connections, such as source metal routing for vertical field-effect transistors (FETs), and/or emitter metal routing for insulated gate bipolar transistors (IGBTs). Such interruptions in metal routing can increase associated resistance and/or can complicate forming electrical connections when packing an associated semiconductor die.

SUMMARY

According to one general aspect, a semiconductor device may include a plurality of transistors including a plurality of source regions and a plurality of gate electrodes, and a first dielectric layer formed on the plurality of source regions and the plurality of gate electrodes. The semiconductor device may include a first array of low-resistance material formed in the first dielectric layer, with a gate subset of the first array formed on the plurality of gate electrodes and a source subset of the first array formed on the plurality of source regions, and a second dielectric layer formed on the first dielectric layer and on the first array. The semiconductor device may include a second array of low-resistance material formed in the second dielectric layer, with a gate subset of the second array formed on the gate subset of the first array and thereby electrically connected to the plurality of gate electrodes, and a source subset of the second array formed on the source subset of the first array and thereby electrically connected to the plurality of source regions. The semiconductor device may include a gate pad metal formed on the second dielectric layer and electrically connected to the gate subset of the second array, and a source pad metal formed on the second dielectric layer and electrically connected to the source subset of the second array.

According to other general aspects, a semiconductor device may include a plurality of transistors including a plurality of source regions and a plurality of gate electrodes, and a first array of low-resistance plug material formed at a first plug layer on the plurality of transistors, with a gate subset of the first array formed on the plurality of gate electrodes and a source subset of the first array formed on the plurality of source regions. The semiconductor device may include a second array of low-resistance plug material formed at a second plug layer on the first plug layer, with a gate subset of the second array formed on the gate subset of the first array and thereby electrically connected to the plurality of gate electrodes, and a source subset of the second array formed on the source subset of the first array and thereby electrically connected to the plurality of source regions. The semiconductor device may include a gate pad metal formed at a first metal layer on the second plug layer and electrically connected to the gate subset of the second array, and a source pad metal formed at the first metal layer and electrically connected to the source subset of the second array.

According to other general aspects, a method of making a semiconductor device may include forming, in a substrate, a plurality of transistors including a plurality of source regions and a plurality of gate electrodes, and forming a first dielectric layer on the plurality of source regions and the plurality of gate electrode. The method may include forming a first array of low-resistance material in the first dielectric layer, with a gate subset of the first array formed on the plurality of gate electrodes and a source subset of the first array formed on the plurality of source regions, and forming a second dielectric layer on the first dielectric layer and on the first array. The method may include forming a second array of low-resistance material in the second dielectric layer, with a gate subset of the second array formed on the gate subset of the first array and thereby electrically connected to the plurality of gate electrodes, and a source subset of the second array formed on the source subset of the first array and thereby electrically connected to the plurality of source regions. The method may include forming a gate pad metal on the second dielectric layer and electrically connected to the gate subset of the second array, and forming a source pad metal on the second dielectric layer and electrically connected to the source subset of the second array.

The details of one or more implementations are set forth in the accompanying drawings and the description below. Other features will be apparent from the description and drawings, and from the claims.

DETAILED DESCRIPTION

Figure 1:
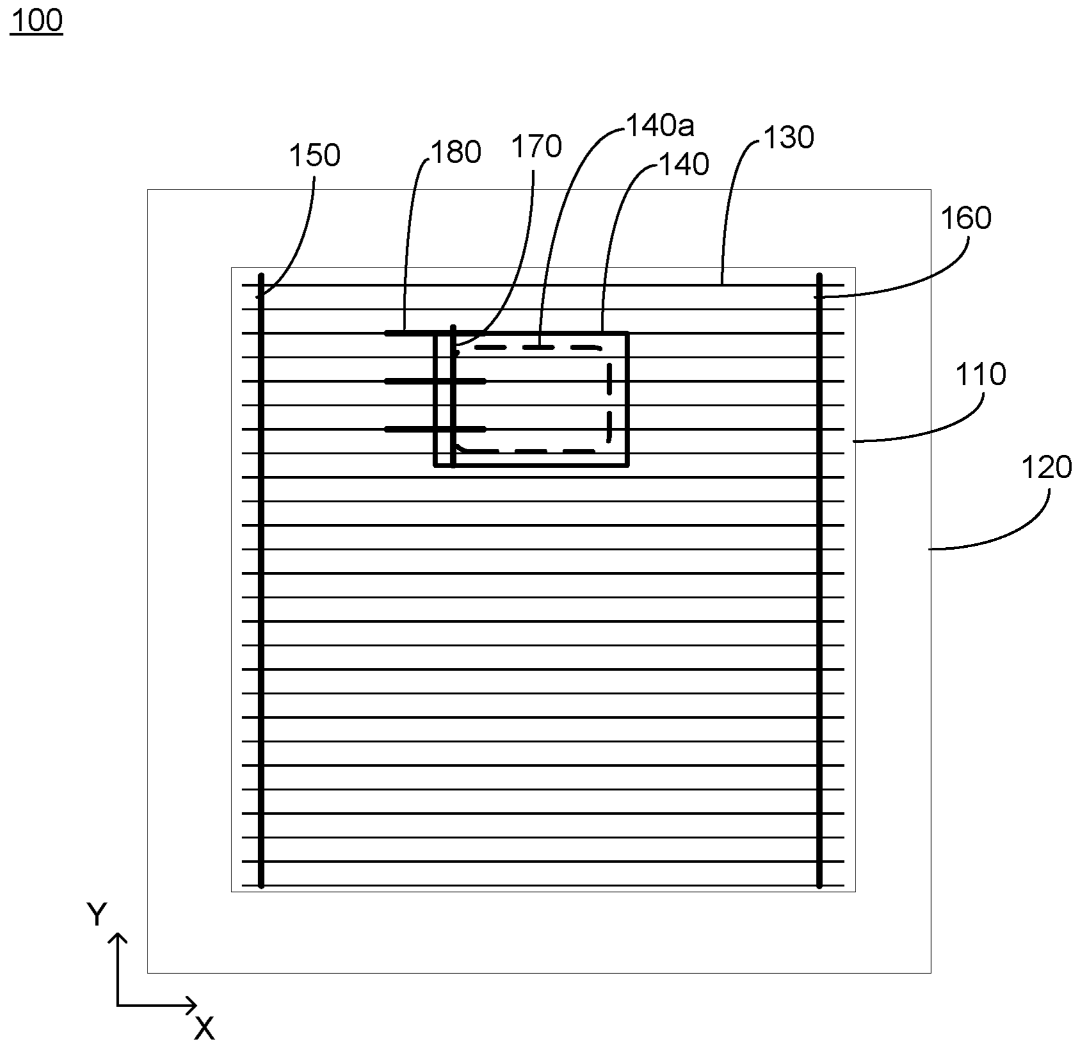
FIG. 1 is a diagram that schematically illustrates a top view of a semiconductor device that includes a selectively landed gate array.

Described techniques overcome the difficulties described above by, e.g., using a metal redistribution layer to enable desired distributions of transistor control signals, such as gate signals. A double plug process is used in which a first array of low-resistance plug material (e.g., a first Tungsten (W) plug) is disposed at a first plug layer, with a first subset of the first array making a first transistor connection type, such as a gate connection, and with a second subset of the first array making a second transistor connection type, such as a source connection.

A second array of low-resistance plug material (e.g., a second Tungsten (W) plug) is disposed at a second plug layer, with a first subset of the second array contacting the first subset of the first array, and thereby continuing, e.g., a gate connection. A second subset of the second array may then contact the second subset of the first array, and thereby continue, e.g., a source connection. Then, the first subset of the second array may be connected to a first connection pad at a first metal layer, such as a gate pad, and the second subset of the second array may be connected to a second connection pad at a second metal layer, such as a source pad.

More particularly, the described arrangement enables selective contact between electrodes and their corresponding connections at an overlying (first) metal layer. For example, the first subset of the first array may be disposed on gate electrodes, and may be partially covered with a dielectric material so as to be electrically insulated from an overlying source pad, while also being partially covered with the first subset of the second array so as to be electrically connected to a gate metal, such as a gate pad or gate runner. Similarly, the second subset of the first array may be disposed on source areas or source electrodes and partially covered with a dielectric material so as to be electrically insulated from an overlying gate pad or gate runner, while also being partially covered with the second subset of the second array so as to be electrically connected to a source pad.

In a more specific example, described in more detail, below, a semiconductor device may include a plurality of vertical transistors with an array of linear gate electrodes being interdigitated with, and parallel to, an array of linear source electrodes. Then, the first array of low-resistance material may have the first subset thereof formed on (e.g., landed directly on) the gate electrodes, with the second subset thereof being formed on (e.g., landed directly on) the source electrodes. Thus, the first subset (which may be referred to as the gate subset) of the first array is interdigitated with the second subset (which may be referred to as the source subset) of the first array at a first plug layer that is above a substrate of the semiconductor device of FIG. 1.

Then, the second array of low-resistance plug material may be selectively formed at a second plug layer that is above the first plug layer, with the first subset (which may be referred to as the gate subset) of the second array selectively formed on the first subset (or gate subset) of the first array (and thereby to the gate electrodes). The second subset (which may be referred to as the source subset) of the second array may be selectively formed on the second subset (or source subset) of the first array (and thereby to the source electrodes). As mentioned above, where the second array of low-resistance plug material is not disposed on the first array of low-resistance plug material, dielectric material may be provided (e.g., at the second plug layer above the first plug layer) so as to selectively insulate the first array at the first plug layer from making undesired connections to pad or runner metals at a first metal layer that is above the second plug layer.

Accordingly, an active area of an associated transistor, as compared to available semiconductor die area, can be increased to one hundred percent, or nearly one-hundred percent, of available semiconductor die area. Such advantages may be obtained while still enabling use of a metal track or runner to carry electrical signals, e.g. gate control signals, of a power transistor, because such tracks or runners may be provided at a first metal layer that is above an active area of the device (e.g., above the second plug layer).

In some implementations, available semiconductor die area can be a semiconductor area within an isolation, or termination region of a corresponding semiconductor die. Such an isolation, or termination region, which can be disposed around at least a portion of a perimeter of a corresponding semiconductor die, can help regulate breakdown voltage of an associated power transistor. For instance, such an isolation region can prevent breakdown from occurring below a rated voltage of the transistor, e.g., by terminating high electric fields during operation of the transistor.

Moreover, signal metal for other connections to the transistor, such as source and/or emitter connections, may be continuous. That is, breaks in signal metal to accommodate routing of metal tracks/runners are avoided in the implementations described herein, because such metal tracks/runners are provided at a first metal layer that is above the active area of the device. This allows for an associated area of source and/or emitter signal metal to be increased, which can, in turn, increase current carrying capability and improve performance of an associated transistor, e.g., for a same die size as conventional implementations, and can also simplify making electrical connections, such as electrical clip or wire bond connections, to the signal metal when packaging the device for use.

The approaches described herein can also provide other advantages. For instance, in some implementations, resistance of a gate connection internal to an associated semiconductor can be easily adjusted, or tuned, with accuracies in the milli-ohm range to the range of hundreds of ohms. Such adjustment can be achieved as a result of slotting at least some of the first subset of the first array of the low-resistance plug material formed on gate electrodes. By providing such slotting, as described in detail below, current may be forced out of the low-resistance plug material and through the relatively higher resistance gate electrode material (e.g., doped polysilicon).

By positioning such slots at a specific location(s), e.g., adjacent to a gate pad connected to an external power source, all gate current may be forced through the gate electrode material beneath the slots. In this way, a gate current of the entire semiconductor device may be provided with a desired resistance using only a desired, localized area within the active area of the device. Then, by adjusting a size and spacing of the slots, desired resistance parameters may be obtained. For example, resistance values may be tuned, and localized heat dissipation that may be associated with fast switching may be controlled.

FIG. 1 is a diagram that schematically illustrates a top view of a semiconductor device that includes a selectively landed gate array. In the example of FIG. 1, the semiconductor device includes an active area 110 and an isolation, or a termination region 120. In the example of FIG. 1, the termination region 120 surrounds the active area 110. That is, the termination region 120 defines an outer perimeter of the active area 110. In some implementations, the termination region 120 can include implants and/or trench structures to terminate electricals fields associated with operation of a transistor implemented in the active area 110 of the semiconductor device of FIG. 1.

As shown in FIG. 1, the semiconductor device 100 includes arrays 130 of low-resistance plug material. That is, as described above, the arrays 130 may include a first array at a first plug layer and a second array disposed at least partially on the first plug layer at a second plug layer. From the top view of FIG. 1, the first plug layer is not distinguishable from the second plug layer, but the first plug layer and the second plug layer are visible in the following examples of, e.g., FIGS. 2-5.

In the example of FIG. 1, the arrays 130 include regularly arranged rows of electrically conductive material, which can be implemented using tungsten or other metal materials. That is, in the implementations of FIGS. 2-12, the arrays 130 may be implemented as linear arrays of the low-resistance plug material. As described with respect to FIG. 13, in other implementations, the arrays 130 may also include a matrix or grid of rows and/or columns of electrically conductive material. For instance, the rows and/or columns may be irregularly spaced or segmented. In other examples, the arrays 130 may define a hexagonal (or other shape) grid. Thus, the specific arrangement of the arrays 130 will depend on the particular implementation desired.

As illustrated in FIG. 1, the arrays 130 may extend over all of, or nearly all of the active area 110, with appropriate spacing from the active area 110 for an associated semiconductor process. The arrangement of the arrays 130 allow for low resistance connections from the arrays 130 to gate electrodes and source electrodes of transistors, which are disposed below the arrays 130 in the active area 110. For example, as noted above, the arrays 130 can be implemented using tungsten, which is approximately one-hundred times less resistive than doped polysilicon of gate electrodes.

The semiconductor device 100 also includes a gate pad area 140 and a gate pad connection area 140*a*. As shown in FIG. 1, the gate pad connection area 140*a* may have a smaller area than the gate pad area 140. A gate runner 150, a gate runner 160, and a gate pad contact runner 170 may be part of a signal distribution layer at a first metal layer of the semiconductor device of FIG. 1.

Figure 7:
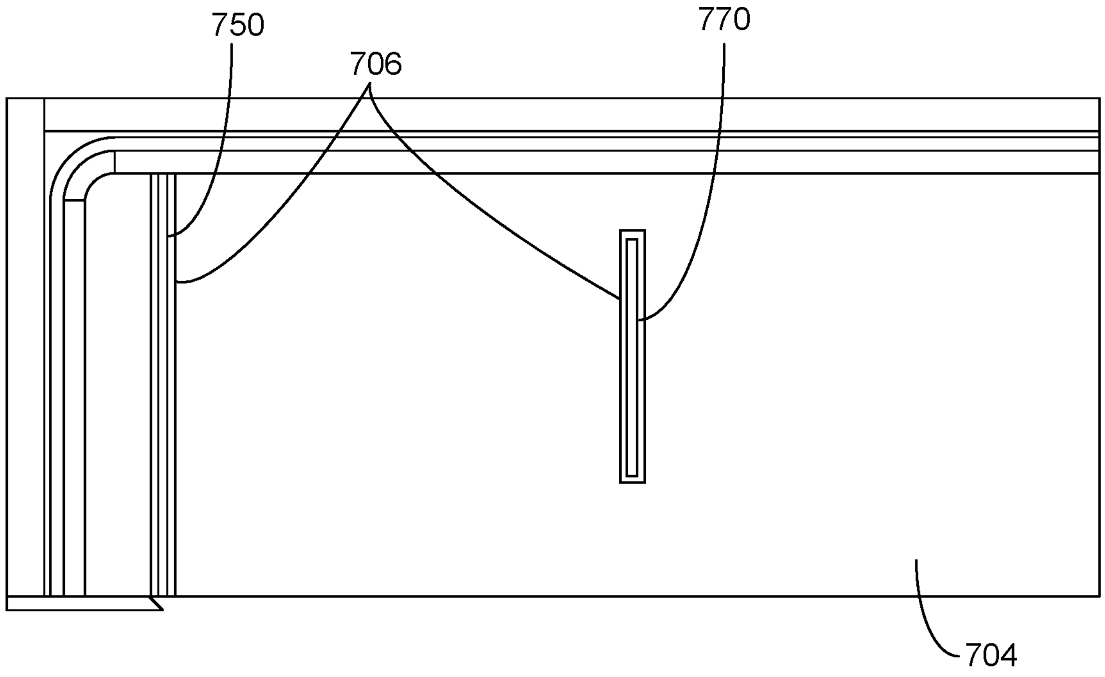
FIG. 7 is a diagram illustrating an example top view of a first metal layer of the semiconductor device of FIG. 1.

As shown in FIG. 7, source pad may also be disposed at the first metal layer (appropriately spaced from the gate runner 150, the gate runner 160, and the gate pad contact runner 170, and from the termination region 120), but is omitted in the example of FIG. 1 for the sake of visibility of the arrays 130. Similarly, in the simplified example of FIG. 1, various dielectric layers are omitted for the sake of visibility of the arrays 130.

The gate runner 150, the gate runner 160, and the gate pad contact runner 170 can be selectively and electrically coupled with a first subset, e.g., a gate subset, of the arrays 130. For example, the gate runner 150, the gate runner 160, and the gate pad contact runner 170, all at the first metal layer, may be selectively connected to (e.g., disposed on) a first (gate) subset of a second array at a second plug layer beneath the first metal layer. In turn, the gate subset of the second array may be connected to an underlying gate subset of a first array at a first plug layer, and thereby to gate electrodes of transistors of the active area 110.

Similarly, the source pad (not illustrated in FIG. 1, as just mentioned) may be selectively and electrically coupled with a second (e.g., source) subset of the second array at the second plug layer beneath the first metal layer. In turn, the source subset of the second array may be connected to an underlying source subset of the first array at the first plug layer, and thereby to source electrodes of transistors of the active area 110.

In the example of FIG. 1, in which the arrays 130 are formed as a linear array(s), the gate subsets of the arrays 130 may be interdigitated with the source subsets of the arrays 130. For example, in FIG. 1, the gate subsets and source subsets may be alternated, so that odd-numbered rows are included in the gate subsets and the even-numbered rows are included in the source subsets.

In the example of FIG. 1, the entire active area 110 of the semiconductor device 100, with appropriate spacing from the termination region 120, can include active transistor segments. Accordingly, area previously used to implement metal gate tracks, contacts, or runners can be eliminated or used for active transistor area. Therefore, a semiconductor die with a smaller area can be used to produce a semiconductor device with a transistor active area that is equivalent to a transistor active area of a semiconductor device constructed using conventional or existing techniques. That is, active area conventionally used for implementing gate metal can be eliminated and a corresponding die size can be reduced by an amount of area used to implement such gate metal (e.g., up to 15% of an associated active area). Said another way, in some implementations, the arrays 130, such as the example implementations described herein, may not reduce an active area, within an active region, of a corresponding semiconductor device, such as the transistors described herein.

Further in FIG. 1, slots 180 may be formed internally to the active area 110 to thereby provide increased internal gate resistance, simply by slotting (e.g., removing, or not forming) a portion of low-resistance plug material of a gate subset of a first array of the arrays 130, at a first plug layer. By providing such slotting, as described and illustrated in more detail, below, e.g., with respect to FIG. 3, gate current may be forced to traverse doped polysilicon of gate electrodes of the transistors in the active area 110, rather than the low-resistance plug material. In other words, in FIG. 1, the slots 180 may be understood to reveal or illustrate underlying doped polysilicon of gate electrodes, which would otherwise be obscured by the arrays 130 in FIG. 1.

Consequently, a gate resistance can be provided without requiring an external gate resistor. A value or extent of the gate resistance (and associated effects such as heat dissipation) may be adjusted or tuned simply by controlling a number, size, or spacing of the slots 180 (which may also thus be referred to as resistors 180). Moreover, the internal gate resistance provided by the slots 180 may be determined independently of a size of a die of the semiconductor device of FIG. 1. Additional examples of resistors 180, and associated features and advantages, are provided below, e.g., with respect to FIGS. 3, 6, and 13.

Figure 2:
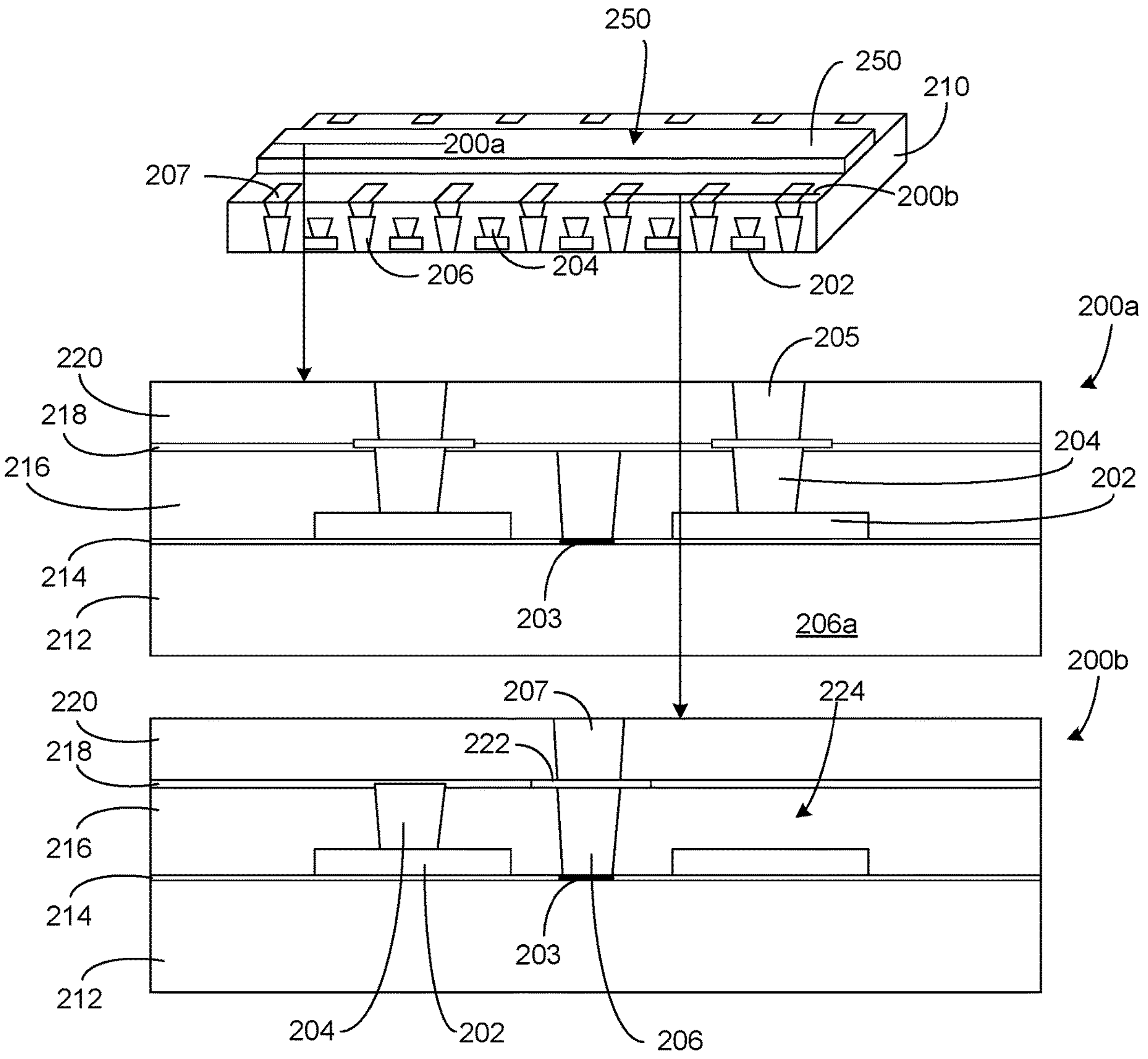
FIG. 2 is a diagram illustrating cross-sectional views of an example implementation of the semiconductor device of FIG. 1.

FIG. 2 is a diagram illustrating cross-sectional views of an example implementation of the semiconductor device of FIG. 1. In the example of FIG. 2, gate electrodes 202 of doped polysilicon are interdigitated with source electrodes (also referred to as source contacts or source metal) 203.

A first array of low-resistance plug material, formed at a first plug layer, includes a gate subset 204 of the first array and a source subset 206 of the first array. A second array of low-resistance plug material, formed at a second plug layer, includes a gate subset 205 of the second array (visible in cross section 200*a*, as described below) and a source subset 207 of the second array.

In other words, as shown in the example of FIG. 2, a first plug layer refers to a layer in which the first array 204, 206 is formed. The first plug layer is above a substrate 212 and below a second plug layer at which the second array 205, 207 of low-resistance plug material is formed. As shown, and as described in detail, below, the gate subset 204 and the source subset 206 (which may also be referred to as gate plugs and source plugs, respectively), may have different lengths in a vertical or Y direction, because each gate plug of the gate subset 204 is formed on an underlying gate electrode 202.

Further in FIG. 2, dielectric material 210 is illustrated as being disposed around the gate subsets 204, 205 and the source subsets 206, 207, and around the gate electrodes 202. The dielectric material 210 may include multiple layers and/or types of dielectric materials as described in detail, below.

A gate metal 250 may be disposed on the dielectric material 210 at a first metal layer. For example, the gate metal 250 may conceptually correspond, e.g., to the gate runner 150, the gate runner 160, or the gate pad contact runner 170 of FIG. 1.

FIG. 2 further illustrates a first cross section 200*a* taken along the gate runner 250. FIG. 2 also illustrates a second cross section 200*b* taken along a plurality of the gate electrodes 202, gate subsets 204/205, and source subsets 206/207.

In the cross-sections 200*a* and 200*b*, the substrate 212 is illustrated, e.g., as including an epitaxial layer, which can be an n-type epitaxial layer with a doping concentration that is less a doping concentration of an underlying portion of the substrate 212 (not shown in FIG. 2). Such a substrate may be, e.g., a heavily doped n-type substrate, such as a Silicon Carbide (SiC) substrate, or another semiconductor substrate.

Further in FIG. 2, a gate oxide is formed on the substrate 212 and under the gate electrodes 202. The dielectric material 210 is illustrated as including a dielectric layer 216, which may be, e.g., Borophosphosilicate glass (BPSG), or other suitable dielectric. The dielectric material 210 is also illustrated as including a dielectric layer 220, which may be, e.g., a suitable silicon oxide, nitride, or other suitable dielectric. A buffer layer 218 may be disposed between the dielectric layers 216, 220.

A clad or barrier metal 222 may be disposed between plugs of the first plug layer and the second layer. The barrier metal 222 may be used to avoid reflection during photolithography processing, and, as the barrier metal 222 is wider than adjacent plugs (e.g., gate plugs 204/205 or source plugs 206/207), may be useful in maintaining electrical connections between the first plug layer and the second plug layer, in case of any undesired misalignment(s) that may occur during processing.

In FIG. 2, as described above with respect to FIG. 1, the first plug layer includes the plugs 204, 206 (as well as the gate electrodes 202), the second plug layer includes the plugs 205, 207, and the first metal layer is illustrated as including gate metal 250. As also noted above, and illustrated in more detail below, e.g., with respect to FIGS. 3 and 7, the first metal layer may also include a source pad in contact with the source subset 207 of the second plug layer, as well as any dielectric material needed to maintain separation between the gate metal 250 and such a source pad.

In FIG. 2, a dielectric region 224 corresponds to the slots 180 of FIG. 1, used to provide internal gate resistance for the semiconductor device of FIG. 2. As is visible in FIG. 3 (which may represent, e.g., a cross-sectional view AA in FIG. 1), a current 302 is thus forced to traverse through the gate metal 250, plug 205 at the second plug layer, plug 204*a* at the first plug layer, around the plug slot 224 of dielectric material and through the gate electrode 202, and into plug 204*b* at the first plug layer.

Figure 3:
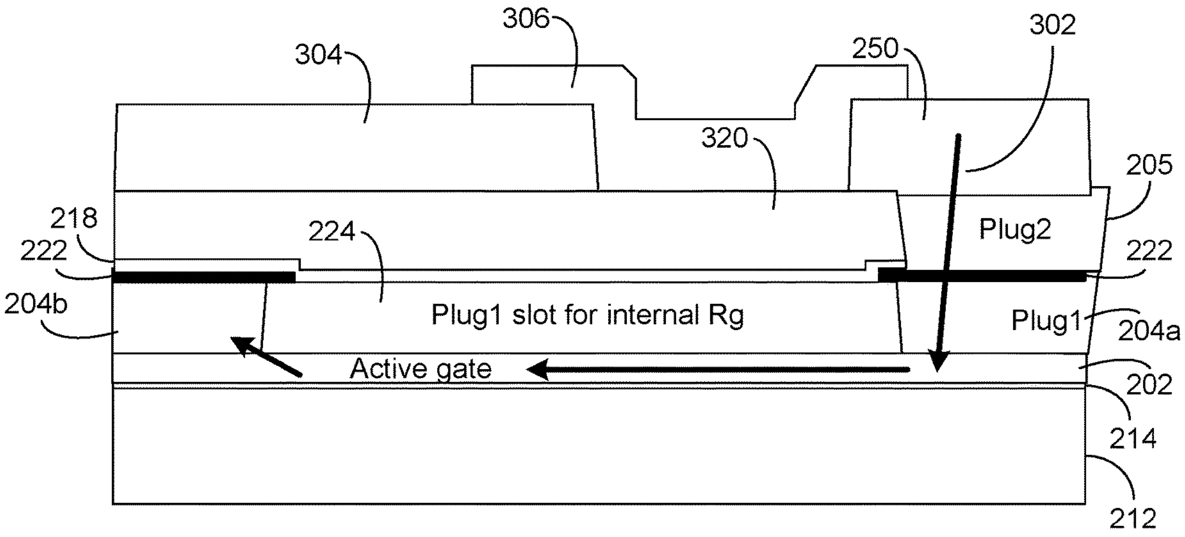
FIG. 3 is a diagram illustrating an additional cross-sectional view of an example implementation of the semiconductor device of FIG. 1.

FIG. 3 also illustrates source pad 304 at the first metal layer. As shown, the source pad 304 may be separated and electrically insulated from the gate metal 250 by a dielectric layer 306.

Figure 4:
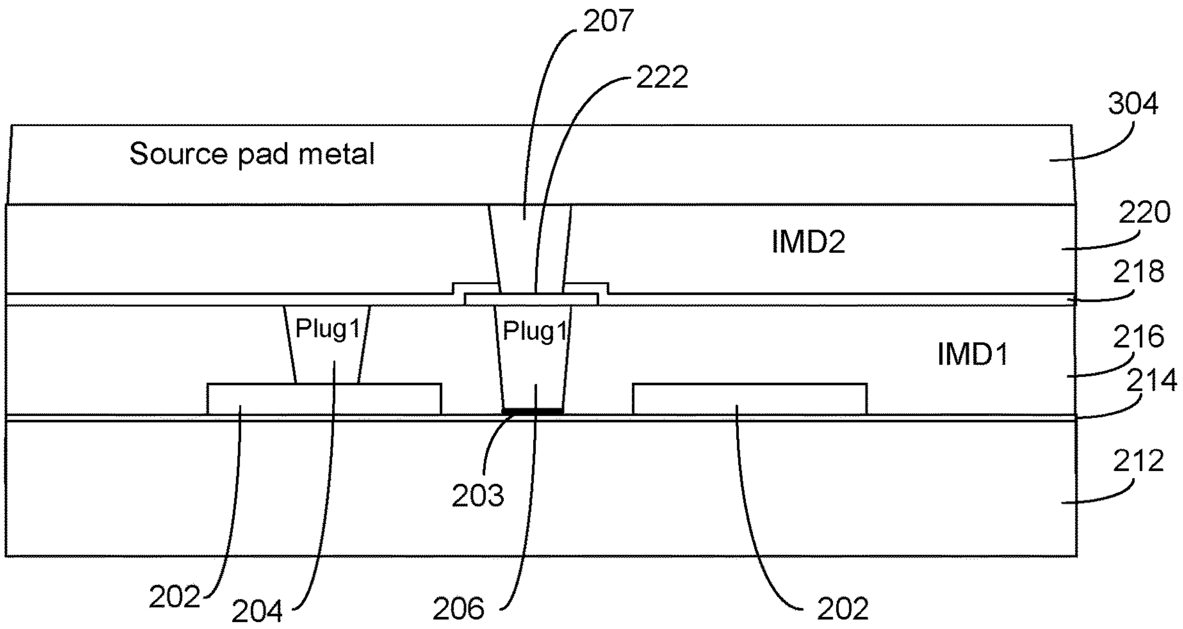
FIG. 4 is a diagram illustrating an additional cross-sectional view of the example implementation of the semiconductor device of FIG. 1.

FIG. 4 is a diagram illustrating an additional cross-sectional view of the example implementation of the semiconductor device of FIG. 1. FIG. 4 shows a more detailed view of the cross-sectional view 200*b* of FIG. 2, which includes the source pad metal 304.

Figure 5:
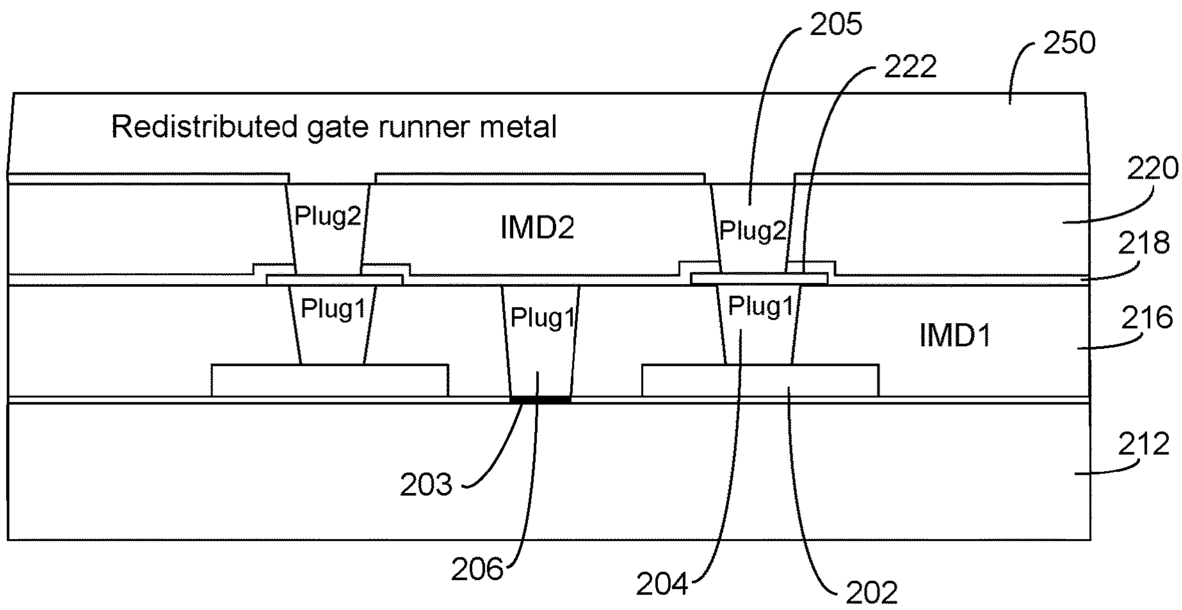
FIG. 5 is a diagram illustrating an additional cross-sectional view of the example implementation of the semiconductor device of FIG. 1.

FIG. 5 is a diagram illustrating an additional cross-sectional view of the example implementation of the semiconductor device of FIG. 1. FIG. 5 shows a more detailed view of the cross-sectional view 200*a* of FIG. 2, which includes redistributed gate runner metal 250.

Figure 6:
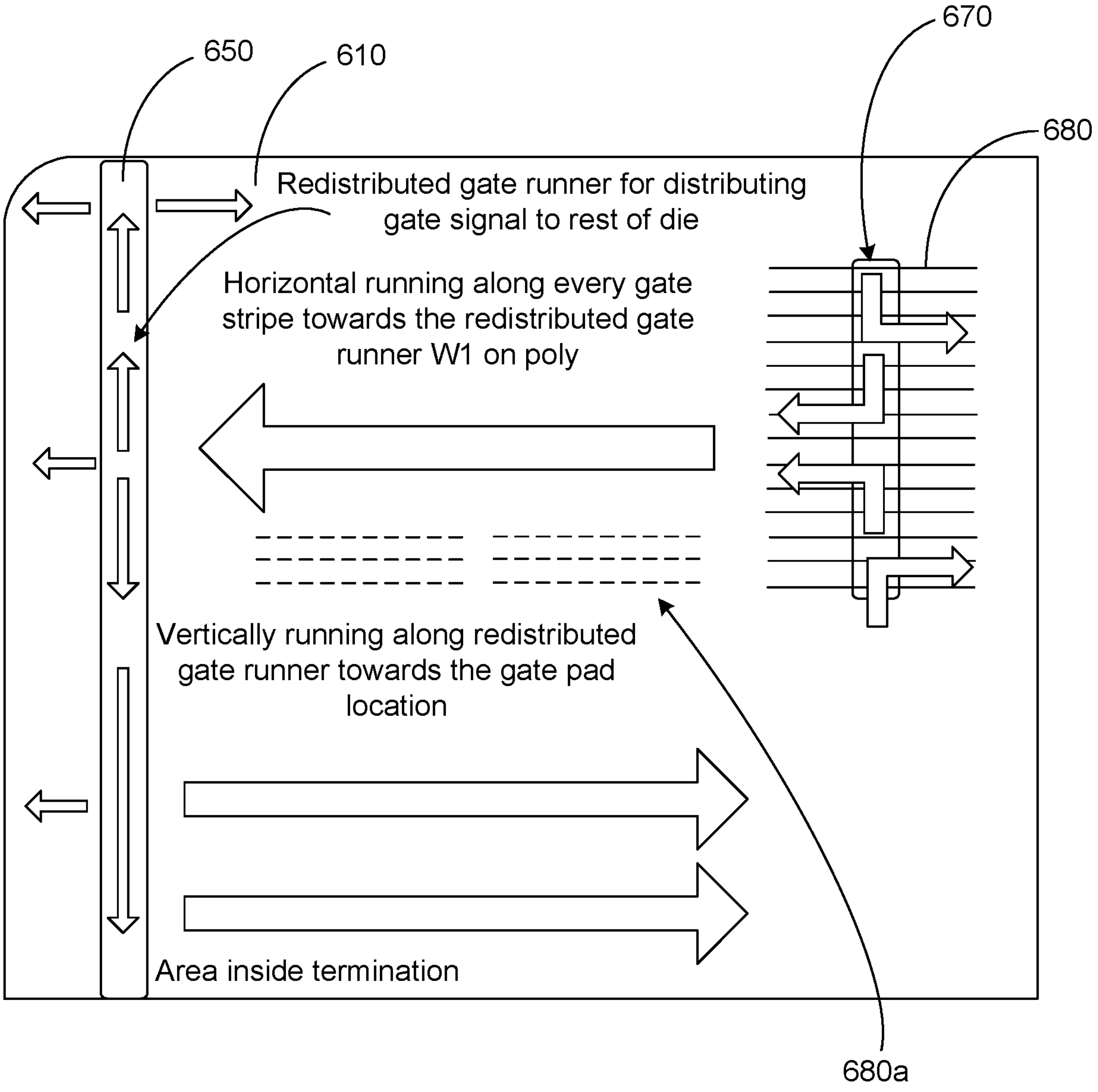
FIG. 6 illustrates an example current flow and internal resistors that may be implemented using the semiconductor device of FIG. 1.

FIG. 6 illustrates an example current flow and internal resistors that may be implemented using the semiconductor device of FIG. 1. FIG. 6 illustrates that an active area 610 may include a gate runner 650 (similar to gate runner 150 of FIG. 1) and a gate pad contact runner 670 (similar to gate pad contact runner 170 of FIG. 1, shown transparently in FIG. 6). Slots 680 correspond to slots/resistors 180 of FIG. 1.

As shown by the various arrows in FIG. 6, all current entering the gate pad contact runner 670 traverses to the gate runner 650 (and to a similar gate runner at an opposite side of the active area 610, not shown in FIG. 6). The gate runner 650 redistributes the current throughout remaining transistors within the active area 610.

As described above, providing the slots 680 provides an internal gate resistance Rg, without requiring a connection to an external resistor. Provided Rg tunability is at least from the milli-ohm range to hundreds of ohms. Example Rg values for SiC power devices may be in the range of about 1-20 ohms.

Further in FIG. 6, dashed lines 680*a* represent slots that are spaced or separated from one another along gate electrodes. As referenced above, fast switching operations of the semiconductor device of FIG. 6 may lead to heat build-up, e.g., within gate electrodes. By spacing the slots 680*a* over a wider area, as shown, localized heat dissipation may be improved, even during fast switching operations.

FIG. 7 is a diagram illustrating an example top view of a first metal layer of the semiconductor device of FIG. 1. As referenced above, a first metal layer may include gate metals 750 and 770. The first metal layer may also include source pad metal 704, e.g., similar to source pad metal 304 of FIG. 3. Also corresponding to FIG. 3, dielectric 706 may be used to separate and electrically insulate the source pad metal 706 from the gate metals 750, 770.

Figure 8:
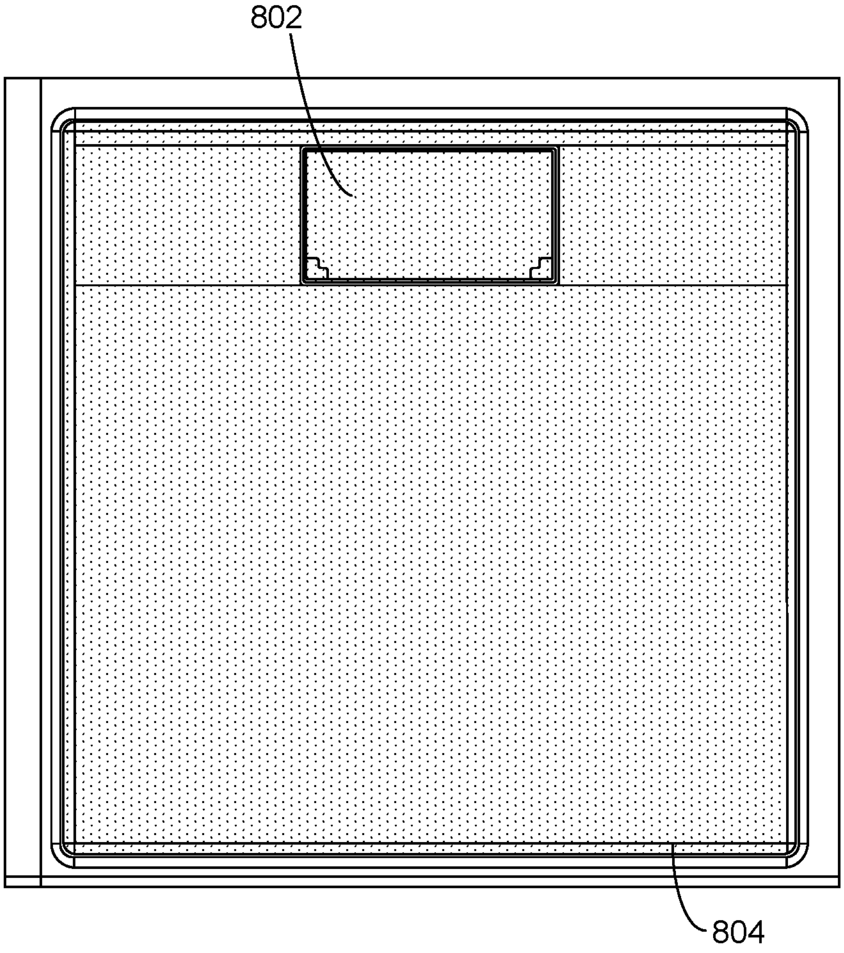
FIG. 8 is a diagram illustrating an example top view of a second metal layer of the semiconductor device of FIG. 1.

FIG. 8 is a diagram illustrating an example top view of a second metal layer of the semiconductor device of FIG. 1. Such a second metal layer is typically used to facilitate external connections of the semiconductor device.

In FIG. 8, a source metal 804 covers essentially all portions of an active area not covered by a gate metal 802. Some additional example details of the second metal layer of FIG. 2 are illustrated below in FIG. 12.

FIGS. 9A, 9B, 10A, 10B, 11A, 11B, 12A, and 12B are diagrams illustrating cross-sectional views of an example manufacturing process for a semiconductor device that includes a selectively landed gate array, in accordance with the examples of FIGS. 1-8. In each of FIGS. 9A, 10A, 11A, 12A, an upper X direction cross section corresponds generally to the cross-sectional view of FIG. 3, while in each of FIGS. 9B, 10B, 11B, 12B, a lower Y direction cross section corresponds to the cross-sectional view of FIG. 4.

Figure 9A:
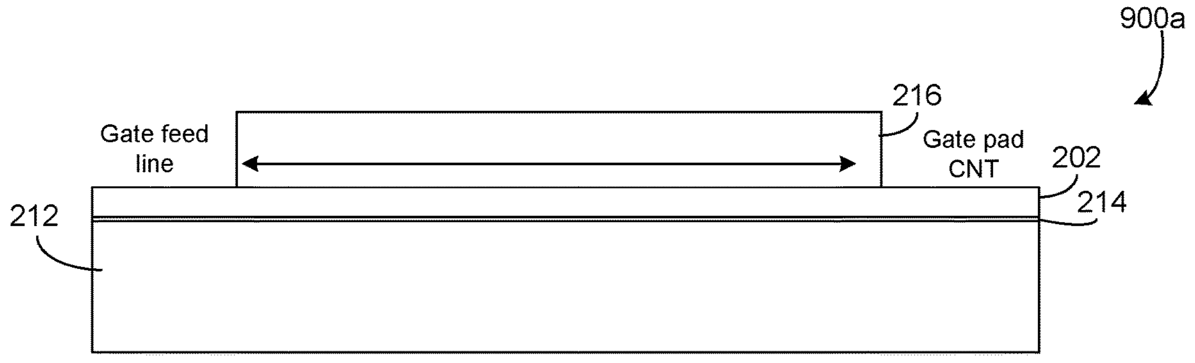
FIG. 9A is a diagram illustrating a first cross-sectional view of a first example stage of a manufacturing process for a semiconductor device that includes a selectively landed gate array.
Figure 9B:
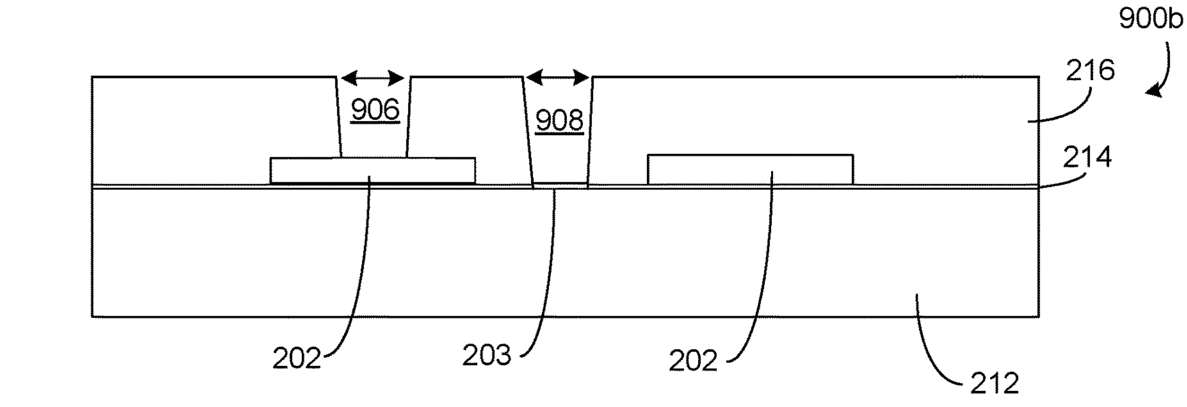
FIG. 9B is a diagram illustrating a second cross-sectional view of a first example stage of a manufacturing process for a semiconductor device that includes a selectively landed gate array.

In FIGS. 9A and 9B, gate oxide 214 has been formed, followed by an annealing processes, followed by deposition of doped polysilicon material that is then etched to form gate electrodes 202. A mask layer (not shown) may be used to form source contact 203. Dielectric 216 may be formed as a layer of BPSG in a reflow process.

Thus, cross-section 900*a* illustrates spaces for a gate feed line and a gate pad contact formed on either side of BPSG dielectric 216, so that the width of the BPSG dielectric 216 provides the type of slot 180 of FIG. 1, e.g., 224 of FIGS. 2 and 3, or 680 (or 680*a*) of FIG. 6. Cross-section 900*b* illustrates establishing openings in the BPSG dielectric 216 to form, e.g., a first array of Tungsten plugs at the first plug layer, including opening 906 for a gate subset of the first array and opening 908 for a source subset of the first array.

Figure 10A:
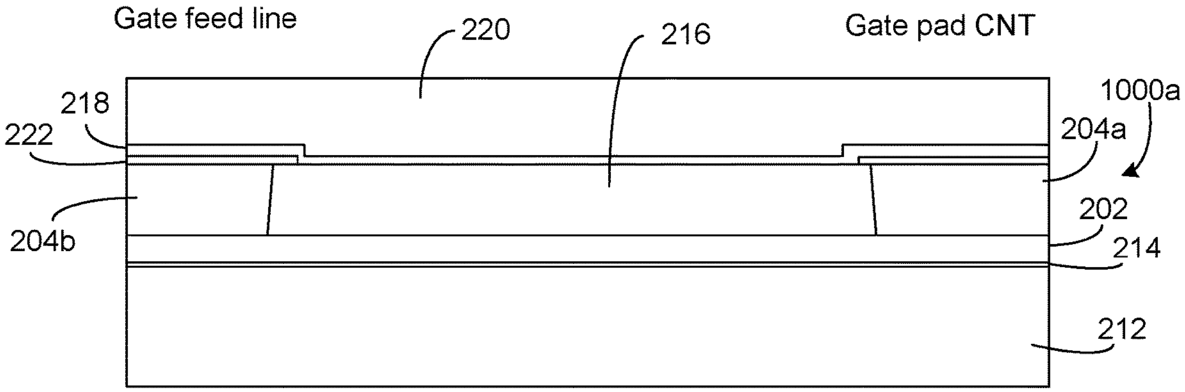
FIG. 10A is a diagram illustrating a first cross-sectional view of a second example stage of a manufacturing process for a semiconductor device that includes a selectively landed gate array.
Figure 10B:
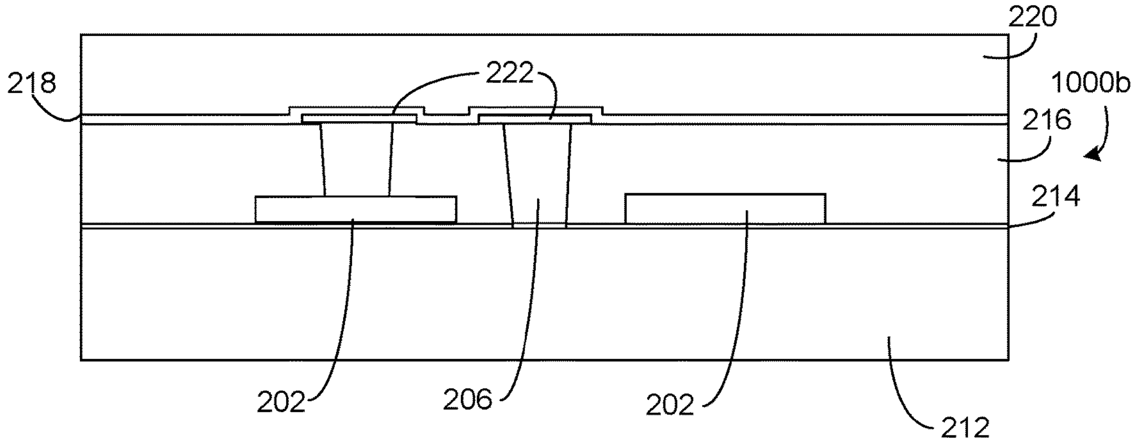
FIG. 10B is a diagram illustrating a second cross-sectional view of a second example stage of a manufacturing process for a semiconductor device that includes a selectively landed gate array.

Cross-section 1000*a* and cross-section 1000*b* of FIGS. 10A and 10B, respectively, illustrate addition of a gate plug(s) 204 and source plug(s) 206. A layer of clad metal 222 is added, followed by buffer layer 218. Then, deposition of the dielectric layer 220 may be performed.

Figure 11A:
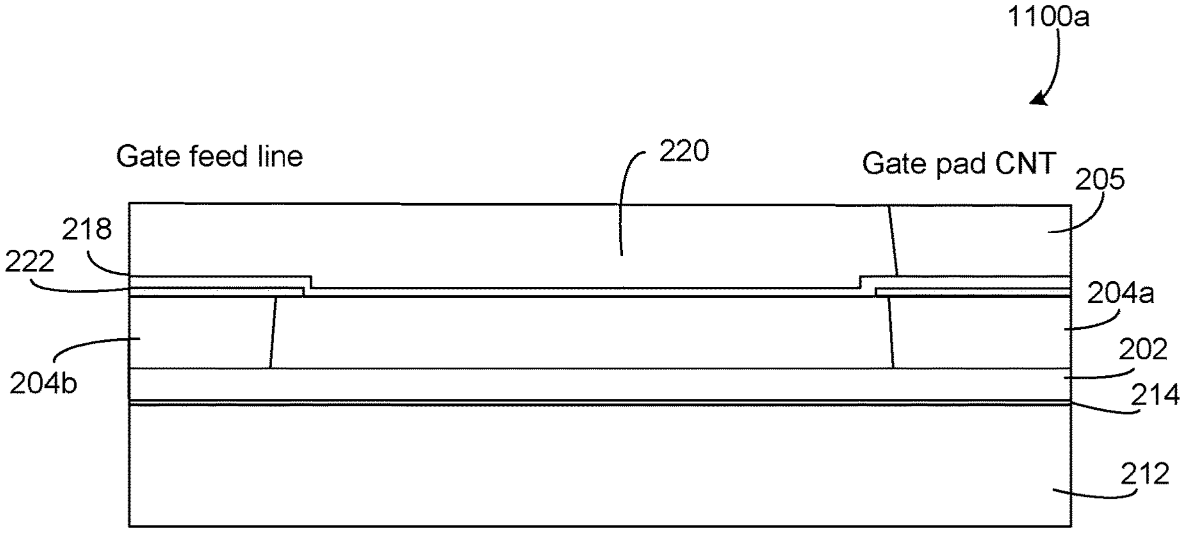
FIG. 11A is a diagram illustrating a first cross-sectional view of a third example stage of a manufacturing process for a semiconductor device that includes a selectively landed gate array.
Figure 11B:
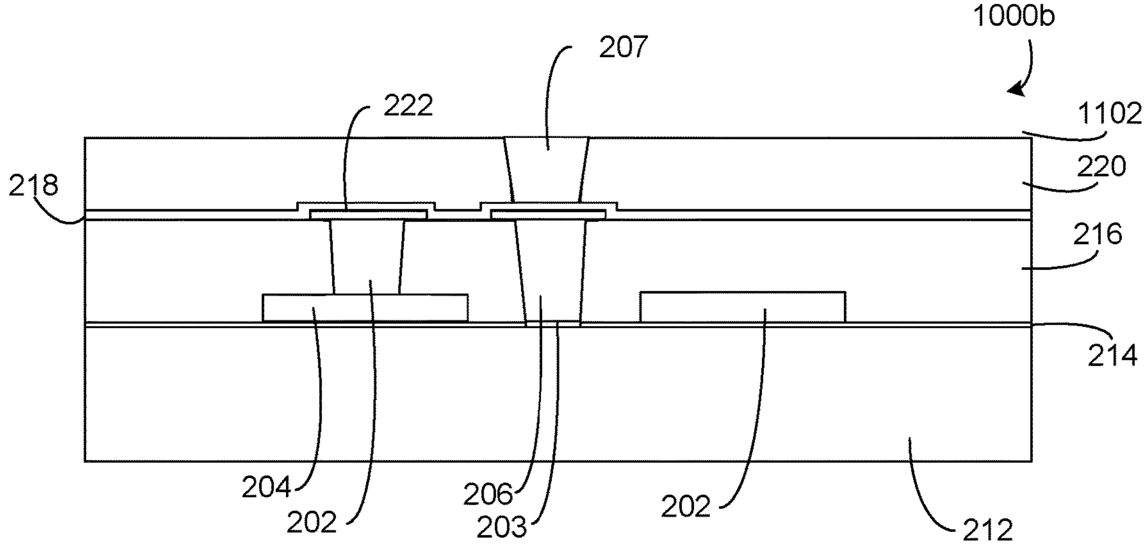
FIG. 11B is a diagram illustrating a second cross-sectional view of a third example stage of a manufacturing process for a semiconductor device that includes a selectively landed gate array.

Cross-section 1100*a* and cross-section 1100*b* of FIGS. 11A and 11B, respectively, illustrate etching of the dielectric layer 220 and the buffer layer 218 to form plugs of the second array at the second plug layer. Specifically, gate plug(s) 205 of the second array are illustrated as being formed in cross-section 1100*a* and source plug(s) 207 of the second array are illustrated as being formed in cross-section 1100*b*.

Figure 12A:
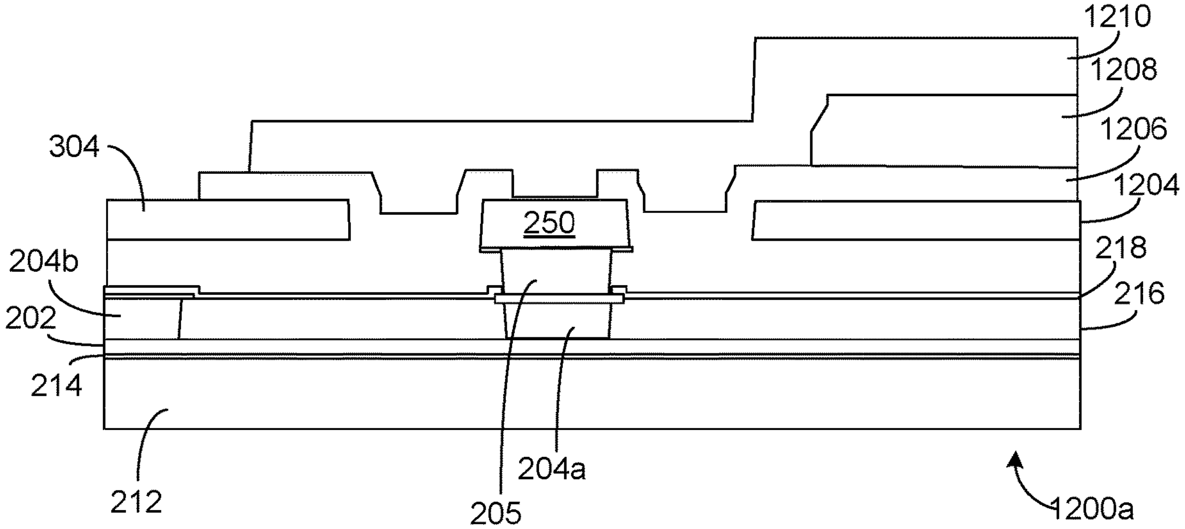
FIG. 12A is a diagram illustrating a first cross-sectional view of a fourth example stage of a manufacturing process for a semiconductor device that includes a selectively landed gate array.
Figure 12B:
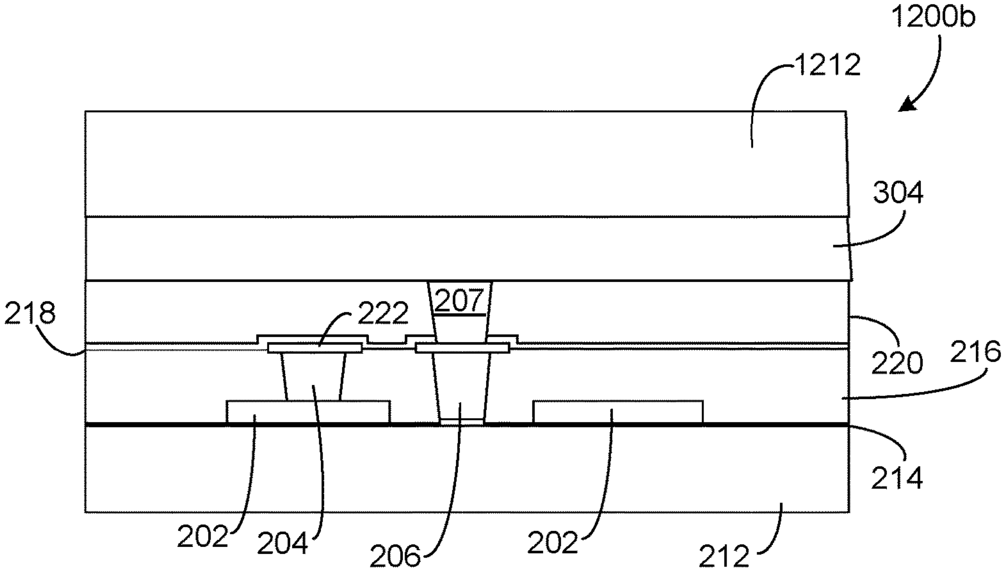
FIG. 12B is a diagram illustrating a second cross-sectional view of a fourth example stage of a manufacturing process for a semiconductor device that includes a selectively landed gate array.

Cross-section 1200*a* and cross-section 1200*b* of FIGS. 12A and 12B, respectively, illustrate formation of a first metal layer that includes gate pad contact 250 and source pad contact 304 and 1204. Then, intermetal dielectric layer 1206 and passivation layer 1208 are formed. A second metal layer may then be formed that includes gate contact 1210 and source contact 1212.

Figure 13:
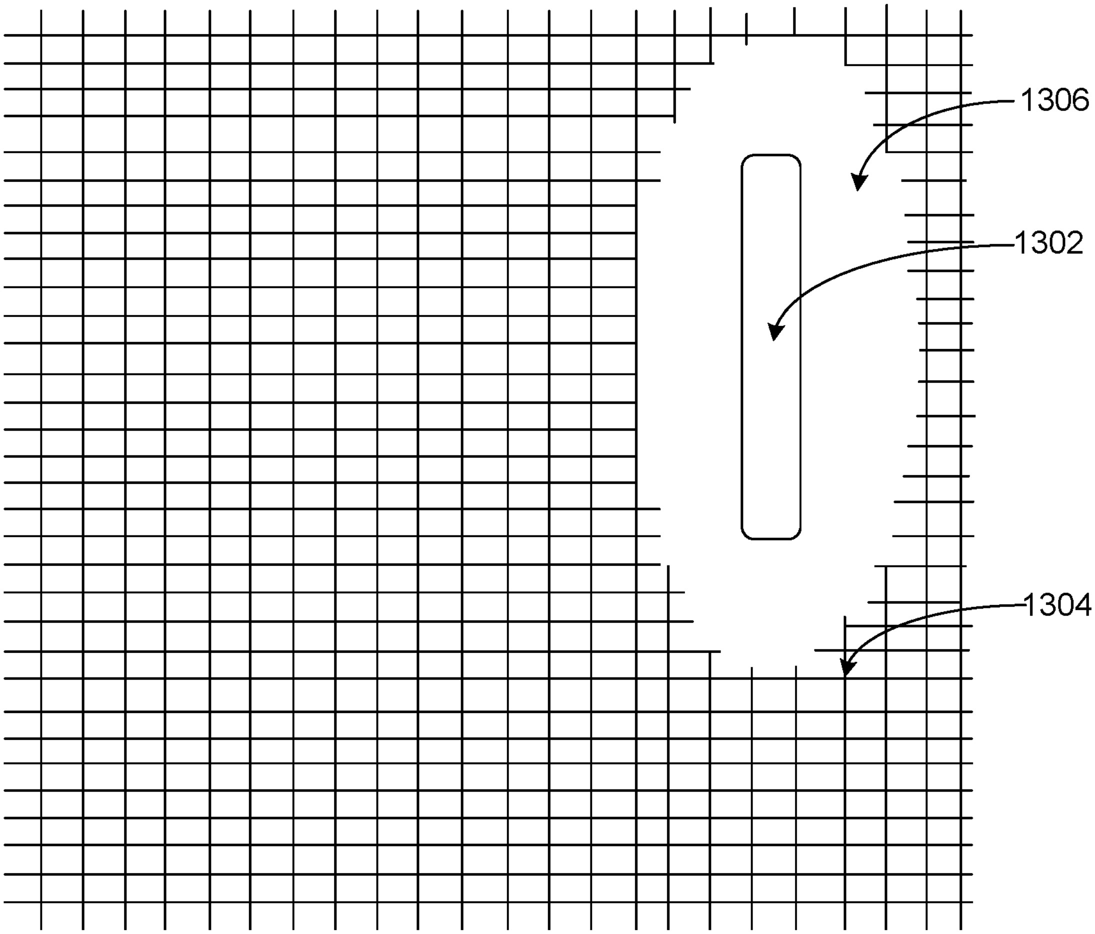
FIG. 13 is a diagram that schematically illustrates a top view of an alternate example of a semiconductor device that includes a selectively landed gate array.

FIG. 13 is a diagram that schematically illustrates a top view of an alternate example of a semiconductor device that includes a selectively landed gate array. In FIG. 13, a gate pad contact runner 1302, similar to the gate pad contact runner 170 of FIG. 1, may be connected by gate plugs at a second plug layer, which are, e.g., analogous to gate plugs 205 of FIGS. 2-5. The gate plugs at the second plug layer are not visible in FIG. 13, due to being obscured by the gate pad contact runner 1302.

Gate plugs at a first plug layer, e.g., analogous to gate plugs 204 of FIGS. 2-5, form a grid 1304 in FIG. 13. That is, the grid 1304 may be understood from the preceding description to be formed on underlying gate electrodes, not visible in FIG. 13 due to being obscured by the grid 1304. In the example of FIG. 13, the illustrated cellular design includes all of the gate electrodes being interconnected, so that redistributed gate runners are not required for signal propagation. In alternative implementations, the square cellular layout of FIG. 13 may be replaced with other layouts, such as hexagonal layouts.

Elliptical region 1306 represents slotting of the gate plugs at the first plug layer, i.e., of the grid 1304, in a vicinity of the gate pad contact runner 1302 (and in a vicinity of underlying gate plugs at the second plug layer). Thus, elliptical region 1306 represents an internal Rg section in which gate current passes through active gate material (e.g., doped polysilicon gate electrodes). Any shape may be used, e.g., circle, oval, square, or rectangle. Additionally, or alternatively, the slotting may be performed at other locations within the grid 1304.

Figure 14:
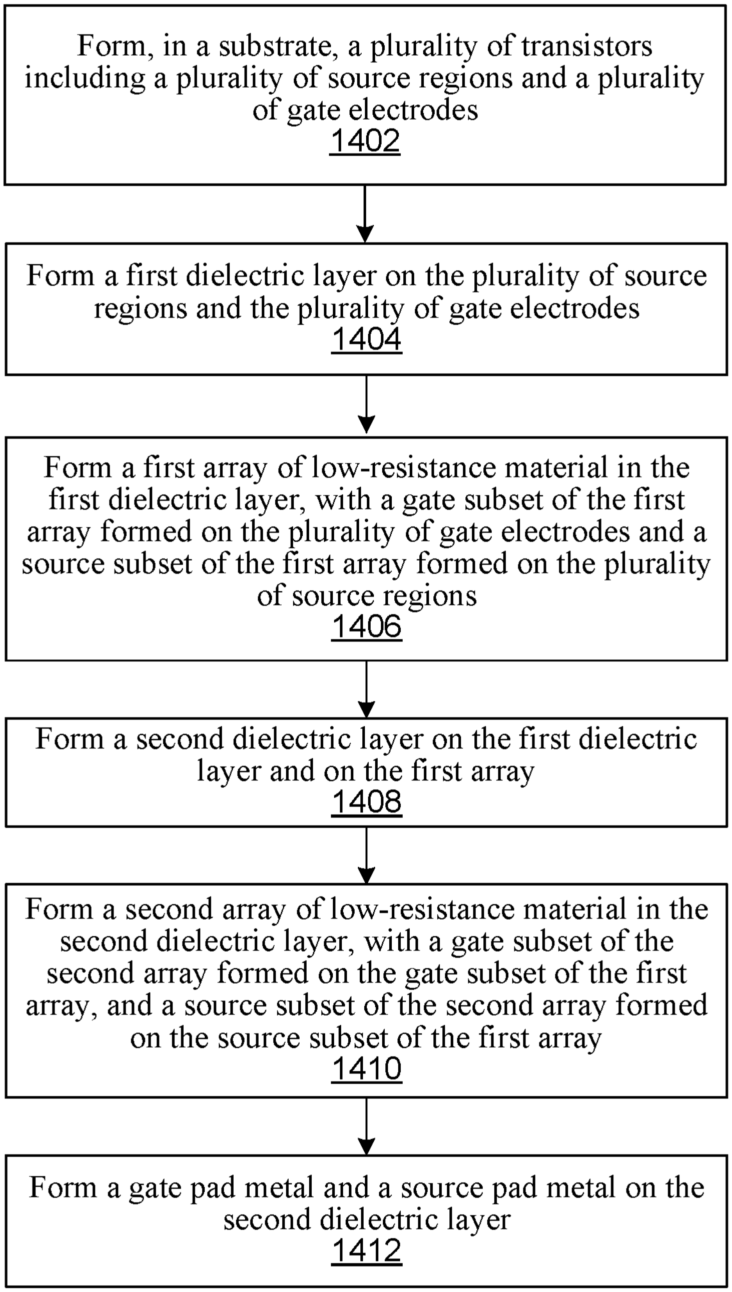
FIG. 14 is a flowchart illustrating an example process flow for manufacturing the devices of FIGS. 1-13.

FIG. 14 is a flowchart illustrating an example process flow for manufacturing the devices of FIGS. 1-13. In the example of FIG. 14, a plurality of transistors, including a plurality of source regions and a plurality of gate electrodes, may be formed in a substrate (1402). A first dielectric layer may be formed on the plurality of source regions and the plurality of gate electrodes (1404).

A first array of low-resistance material may be formed in the first dielectric layer, with a gate subset of the first array formed on the plurality of gate electrodes and a source subset of the first array formed on the plurality of source regions (1406). For example, the first plug layer including Tungsten materials (e.g., Tungsten plugs) may be formed.

A second dielectric layer may be formed on the first dielectric layer and on the first array (1408). A second array of low-resistance material may be formed in the second dielectric layer, with a gate subset of the second array formed on the gate subset of the first array and thereby electrically connected to the plurality of gate electrodes, and a source subset of the second array formed on the source subset of the first array and thereby electrically connected to the plurality of source regions (1410). For example, the second plug layer including Tungsten materials (e.g., Tungsten plugs) may be formed.

A gate pad metal and a source pad metal may be formed on the second dielectric layer (1412). For example, the gate pad metal may be formed on the second dielectric and electrically connected to the gate subset of the second array, and a source pad metal may be on the second dielectric layer and electrically connected to the source subset of the second array.

In the various example implementations described herein, and in other example implementations, the various transistor devices may be provided as planar-gate or trench-gate devices. Depending on the specific arrangement of elements of the transistor devices, and/or a doping profile of elements of the transistor devices, a transistor device referenced above may be implemented, for example, as a vertical field-effect transistor (FET), or an insulated gate bipolar transistor (IGBT).

In the example implementations described herein, the transistor devices may be implemented as vertical transistors implemented in a substrate, which can be a heavily doped n-type substrate, such as a SiC substrate, or another semiconductor substrate. Such vertical transistor devices may also include an epitaxial layer, which can be an n-type epitaxial layer with a doping concentration that is less than a doping concentration of an underlying substrate. For example, such a substrate may include, or implement, a drain terminal of a vertical transistor (or a collector terminal in an IGBT implementation). An epitaxial layer can implement a drift region of a vertical transistor. The majority carrier flow in the preceding example would be electrons, though would be holes if conductivity types of the vertical transistor were reversed, switching n-type and p-type conductivities.

The vertical transistor can include body regions, which can be p-type well regions that can also be referred to as bulk regions. Source regions (or emitter regions for an IGBT implementation) can be disposed in the body regions. In operation, applying an appropriate bias to a gate electrode forms a conduction channel from source regions, through body regions to an epitaxial layer (e.g., to a drift region of the vertical transistor).

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A semiconductor device, comprising:

a plurality of transistors including a plurality of source regions and a plurality of gate electrodes;

a first dielectric layer formed on the plurality of source regions and the plurality of gate electrodes;

a first array of low-resistance material formed in the first dielectric layer, with a gate subset of the first array formed on the plurality of gate electrodes and a source subset of the first array formed on the plurality of source regions;

a second dielectric layer formed on the first dielectric layer and on the first array;

a second array of low-resistance material formed in the second dielectric layer, with a gate subset of the second array formed vertically above the gate subset of the first array in a direction perpendicular to a surface of the first dielectric layer and electrically connected to the plurality of gate electrodes, and a source subset of the second array formed vertically above the source subset of the first array in a direction perpendicular to the surface of the first dielectric layer and electrically connected to the plurality of source regions;

a gate pad metal formed on the second dielectric layer and electrically connected to the gate subset of the second array; and a source pad metal formed on the second dielectric layer and electrically connected to the source subset of the second array.

2. The semiconductor device of claim 1, wherein the first array and the second array are linear arrays, and the gate subset of the first array and the source subset of the first array are parallel to one another, with the gate subset of the second array landed on the gate subset of the first array, and the source subset of the second array landed on the source subset of the first array.

3. The semiconductor device of claim 1, wherein the gate pad metal and the source pad metal are disposed in a first metal layer, and further comprising:

a gate runner disposed in the first metal layer and separated from the gate pad metal, and connected to the gate pad metal via a path routing through the gate subset of the first array, the gate subset of the second array, and the plurality of gate electrodes.

4. The semiconductor device of claim 1, wherein at least one of the gate subset of the first array is slotted above an underlying gate electrode of the plurality of gate electrodes, with the first dielectric layer thereby being in contact with the underlying gate electrode within a slot, so that a gate current through the at least one of the gate subset of the first array is directed through the underlying gate electrode under the slot during operation of the semiconductor device.

5. The semiconductor device of claim 4, wherein each of the gate subset of the first array connected to the gate pad metal by corresponding ones of the gate subset of the second array are slotted above underlying gate electrodes, so that all of the gate current through the gate pad metal traverses the underlying gate electrodes during operation of the semiconductor device.

6. The semiconductor device of claim 1, wherein:

the first array and the second array include tungsten; and the plurality of gate electrodes includes doped polysilicon.

7. The semiconductor device of claim 1, wherein the plurality of transistors are included in a silicon carbide (SiC) semiconductor region.

8. The semiconductor device of claim 7, wherein:

the plurality of transistors includes vertical field-effect transistors (FETs), and the SiC semiconductor region includes a drift region of the vertical FETs and a drain region of the vertical FETs.

9. The semiconductor device of claim 7, wherein:

the plurality of transistors includes a vertical insulated gate bipolar transistor (IGBT), with the plurality of source regions including emitter regions of the vertical IGBT, and the SiC semiconductor region including a drift region of the vertical IGBT and a collector region of the vertical IGBT.

10. A semiconductor device, comprising:

a plurality of transistors including a plurality of source regions and a plurality of gate electrodes;

a first array of low-resistance plug material formed at a first plug layer on the plurality of transistors, with a gate subset of the first array formed on the plurality of gate electrodes and a source subset of the first array formed on the plurality of source regions;

a second array of low-resistance plug material formed at a second plug layer on the first plug layer, with a gate subset of the second array formed vertically above the gate subset of the first array in a direction perpendicular to a surface of the first array and electrically connected to the plurality of gate electrodes, and a source subset of the second array formed vertically above the source subset of the first array in the direction perpendicular to the surface of the first array and electrically connected to the plurality of source regions;

a gate pad metal formed at a first metal layer on the second plug layer and electrically connected to the gate subset of the second array; and a source pad metal formed at the first metal layer and electrically connected to the source subset of the second array.

11. The semiconductor device of claim 10, wherein the first array and the second array are linear arrays, and the gate subset of the first array and the source subset of the first array are parallel to one another, with the gate subset of the second array landed on the gate subset of the first array, and the source subset of the second array landed on the source subset of the first array.

12. The semiconductor device of claim 10, further comprising:

a gate runner disposed in the first metal layer and separated from the gate pad metal, and connected to the gate pad metal via a path routing through the gate subset of the first array, the gate subset of the second array, and the plurality of gate electrodes.

13. The semiconductor device of claim 10, wherein at least one of the gate subset of the first array is slotted above an underlying gate electrode of the plurality of gate electrodes, with a dielectric layer being in contact with the underlying gate electrode within a slot, so that a gate current through the at least one of the gate subset of the first array is directed through the underlying gate electrode under the slot during operation of the semiconductor device.

14. The semiconductor device of claim 13, wherein each of the gate subset of the first array connected to the gate pad metal by corresponding ones of the gate subset of the second array are slotted above underlying gate electrodes, so that all of the gate current through the gate pad metal traverses the underlying gate electrodes during operation of the semiconductor device.

15. The semiconductor device of claim 10, wherein:

the first array and the second array include tungsten; and the plurality of gate electrodes includes doped polysilicon.

16. The semiconductor device of claim 10, wherein the plurality of transistors are included in a silicon carbide (SiC) semiconductor region.

17. A method of making a semiconductor device, comprising:

forming, in a substrate, a plurality of transistors including a plurality of source regions and a plurality of gate electrodes;

forming a first dielectric layer on the plurality of source regions and the plurality of gate electrodes;

forming a first array of low-resistance material in the first dielectric layer, with a gate subset of the first array formed on the plurality of gate electrodes and a source subset of the first array formed on the plurality of source regions;

forming a second dielectric layer on the first dielectric layer and on the first array;

forming a second array of low-resistance material in the second dielectric layer, with a gate subset of the second array formed vertically above the gate subset of the first array in a direction perpendicular to a surface of the first dielectric layer and electrically connected to the plurality of gate electrodes, and a source subset of the second array formed vertically above the source subset of the first array in a direction perpendicular to the surface of the first dielectric layer and electrically connected to the plurality of source regions;

forming a gate pad metal on the second dielectric layer and electrically connected to the gate subset of the second array; and forming a source pad metal on the second dielectric layer and electrically connected to the source subset of the second array.

18. The method of claim 17, further comprising:

forming the first array and the second array as linear arrays, with the gate subset of the first array and the source subset of the first array being parallel to one another;

landing the gate subset of the second array on the gate subset of the first array; and landing the source subset of the second array on the source subset of the first array.

19. The method of claim 17, wherein the gate pad metal and the source pad metal are disposed in a first metal layer, and further comprising:

providing a gate runner in the first metal layer and separated from the gate pad metal, and connected to the gate pad metal via a path routing through by the gate subset of the first array, the gate subset of the second array, and the plurality of gate electrodes.

20. The method of claim 17, further comprising:

forming a slot in at least one of the gate subset of the first array and above an underlying gate electrode of the plurality of gate electrodes, with the first dielectric layer thereby being in contact with the underlying gate electrode within the slot, so that a gate current through the at least one of the gate subset of the first array is directed through the underlying gate electrode under the slot during operation of the semiconductor device.

* * * * *